US005246884A

United States Patent [19]
Jaso et al.

[11] Patent Number: 5,246,884
[45] Date of Patent: Sep. 21, 1993

[54] CVD DIAMOND OR DIAMOND-LIKE CARBON FOR CHEMICAL-MECHANICAL POLISH ETCH STOP

[75] Inventors: Mark A. Jaso, Yorktown Heights; Paul B. Jones, Wappingers Falls; Bernard S. Meyerson; Vishnubhai V. Patel, both of Yorktown Heights, all of N.Y.

[73] Assignee: International Business Machines Corporation, Armonk, N.Y.

[21] Appl. No.: 784,280

[22] Filed: Oct. 30, 1991

[51] Int. Cl.⁵ .......................................... H01L 21/302
[52] U.S. Cl. .................................. 437/225; 437/228; 437/190; 156/636; 156/645
[58] Field of Search ....................... 437/190, 225, 228; 156/645, 636

[56] References Cited

U.S. PATENT DOCUMENTS 4,671,851 6/1987 Beyer et al. ......................... 156/645
4,944,836 7/1990 Beyer et al. ......................... 156/645

OTHER PUBLICATIONS

W. E. Mutter, "Choice Stop Material for Chemical/-Mechanical Planarization," *IBM Tech. Disc. Bull.*, vol. 27, No. 8, Jan. 1985, pp. 4642.

A. Sawabe et al., "Growth of Diamond Thin Films by Electron-Assisted CVD and Their Characterization," *Thin Solid Films*, vol. 137, 1986 pp. 89-99.

Y. Hirose et al., "Synthesis of Diamond Thin Films by CVD Using Organic Compounds," *J. Journal of Applied Phys.*, vol. 25, pt. 2, No. 6, 1986 pp. L519-L521.

K. D. Beyer et al, "Glass Planarization by Stop-Etch Polishing" *IBM Tech. Disc. Bull.*, vol. 27, No. 8, Jan. 1985, p. 4700.

Research Disclosure, RD-326,035A Jun. 10, 1991 "Planarization of Rough Surfaces—Using SOG and CMP".

Primary Examiner—Brian E. Hearn
Assistant Examiner—Laura M. Holtzman
Attorney, Agent, or Firm—Dale M. Crockatt

[57] ABSTRACT

Metallized semiconductor chips, such as are intended for VLSI, are coated with a first layer of $SiO_2$ followed by a second layer of CVD diamond or DLC as an etch stop. The resulting structure is reproducibly and controllably planarized using a chem-mech slurry and an appropriate polishing pad, enabling subsequent layers to be built up similarly.

25 Claims, 1 Drawing Sheet

1. SPUTTER DEPOSIT SiO₂

2. ADD CVD DIAMOND

3. AFTER SHORT POLISHING TIME

4. AFTER MEDIUM POLISHING TIME

5. AFTER LONG POLISHING TIME

CVD DIAMOND OR DIAMOND-LIKE CARBON FOR CHEMICAL-MECHANICAL POLISH ETCH STOP

FIELD OF THE INVENTION

The present invention relates to the manufacture of high performance Very Large Scale Integrated (VLSI) semiconductor chips in general and, more particularly, to a method for planarizing topographical features and films on a substrate according to a chemical-mechanical (chem-mech) polishing technique combined with a diamond or diamond-like etch stop material. The above method is used in the fabrication of planarized multilevel metallized semiconductor structures.

BACKGROUND OF THE INVENTION

A semiconductor chip consists of an array of devices whose contacts are interconnected by patterns of metal wiring called traces. In VLSI chips, these metal patterns are multilayered and separated by layers of an insulating material. Interlevel contacts between metal wiring patterns are made by through-holes (aka via holes), which are etched through the layers of insulating material. Typical chip designs consist of one or two wiring levels, with three wiring levels being the current state of the art. Circuit cost and performance continue to place demand on the fabrication processes, so that adding supplementary wiring levels can be competitive even though additional processing steps are required. However, the technique using via holes, although widely used today, has multiple limitations and drawbacks in that, as the number of metallization layers increases, wiring and level-to-level alignment become increasingly difficult.

In the art of making VLSI semiconductor devices, a silicon wafer is metallized with circuitry traces and pads, typically of aluminum-copper alloy, sputter coated overall with SiO2, resulting in an irregular topography. It is necessary to achieve a smooth topography without damaging the circuitry traces and pads or insulation in order to align devices precisely level-to-level.

Etch stops and polishing slurries are known in the art. U.S. Pat. No. 4,671,852 issued Jun. 9, 1987 to Beyer et al and assigned to the assignee of the present invention, for example, describes the removal of undesired SiO2 protuberances called "bird's heads" using a combination of chem-mech polishing and Si3N4 blanket deposited at 700 degrees C. by Low Pressure Chemical Vapor Deposition (LPCVD). Among other descriptive material included therein, the patent is useful for its description of the importance of the selection of polishing pads and the dependency of polishing success on the polishing solution chemistry which is set forth in column 6, lines 16-27.

U.S. Pat. No. 4,944,836 issued Jul. 31, 1990 to Beyer et al and assigned to the assignee of the present invention describes a new chem-mech polishing slurry to be used with Si3N4 etch stop layer, the water-based alumina slurry formerly used having been found lacking with respect to the etch rate ratio of AlCu to SiO2.

Not all semiconductor structures are compatible with processing at a high temperature level such as 700 degrees C. For example, in multilevel interconnection levels on wafers with actual circuits, it is necessary to maintain all processing steps at or below about 400 degrees C. in order to prevent diffusion of metal into the underlying devices. Silicon nitride deposited at a temperature compatible with the processing of interconnects, i.e. at about 325 degrees C., has proven to be insufficiently hard to function effectively as an etch stop in such "Back End Of the Line (BEOL)" processes. Aluminum oxide, Al2O3, which is harder than SiO2, has proven to polish at a faster rate than SiO2, presumably due to chemical reactions with the polish, making it an ineffective etch stop material.

Radio frequency (RF) and direct current (DC) sputtering, and hot filament CVD, electron-assisted CVD, thermal CVD and plasma-enhanced CVD (PECVD) of diamond and amorphous hydrogenated diamond-like carbon (DLC) films has been reported. An article by Sawabe et al in *Thin Solid Films* Vol. 137, pp. 89-99, reports chemical vapor deposition of a carbon film with interplanar spacings in good agreement with reported values for cubic diamond as measured by reflection high energy electron diffraction (RHEED). The authors also report that the film's hardness, thermal conductivity, and electrical resistivity are almost the same as natural diamond. In *Japanese Journal of Applied Physics* Vol. 25 part 2, no. 6, pp. 519-521, Hirose et al report a film whose measurements of RHEED, Raman spectra, Vicker's hardness, and specific gravity indicate a diamond film.

However, no known art reports that use of a diamond or diamond-like carbon film as a chemical-mechanical polishing etch stop, and no known art reports CVD of such a film at temperatures and having properties compatible with BEOL processing. Hard carbon films are known, but not as an etch stop. Also, compatibility with BEOL processing of such diamond or diamond-like carbon layers is not known in the art.

The chemical-mechanical polish works by chemically dissolving and mechanically abrading the SiO2 layer coating over the metallized wafer. The polish is comprised of an alkali silica slurry. It is important that any etch stop polish slower in the alkaline slurry than the SiO2 or than quartz, a crystalline form of SiO2, or any other material that may be coated over the metallized wafer. Diamond, graphite and amorphous carbon are insoluble in water, acid and alkali and are harder than SiO2 and quartz, DLC layers having a hardness of about 3000 to about 9000 Kg/mm2. The etch stop determines the end point of the polishing process. Diamond and DLC, because of their greater hardness in relation to that of SiO2, make end-point detection in the polishing process controllable. The greater hardness of diamond or DLC in relation to that of SiO2, combined with the chemical inertness of the diamond or DLC means that the etch rate ratio of SiO2:diamond or DLC can equal from about 19:1 up to about 311:1. This ratio range is particularly attractive for feature step heights in BEOL processes. DLC adheres well on most surfaces, such as on Si, SiO2, and carbide forming metals.

Planarization permits improved control of subsequent lithographic steps to prepare for subsequent levels of metallized circuit traces and pads, and to prevent circuit traces from cracking, which can occur when metal traces are disposed over stepped surface features.

SUMMARY

It is therefore an object of the invention to provide a semiconductor device having surface planarity.

It is another object of the invention to provide a VLSI device having interlevel planarity.

It is another object of the invention to provide a planar surface on a semiconductor device by chem-mech etching/polishing using techniques and materials that result in predictable rates of SiO2 removal from run to run.

It is another object of the invention to planarize all high spots on the surface of the device without sacrificing uniformity of insulator thickness.

It is another object of the invention to provide an etch stop material under conditions which are compatible with BEOL processing.

It is another object of the invention to provide an etch stop material which is harder than SiO2 and is relatively more resistant to the chem-mech slurry chemistry.

It is another object of the invention able to clean thoroughly the planarized device after the step of etching, including nondestructively removing vestiges of the etch stop material once it has served its purpose.

These and other objects are achieved according to the present invention in which planarity of a semiconductor device is produced by a method which includes: providing a substrate on which are disposed topographical features and which is coated overall by a first layer of insulating material; depositing on the layer of insulating material a second layer comprising diamond or diamond-like carbon (DLC) as an etch stop; chem-mech polishing for a preselected time in a slurry and with a polishing pad such that the first layer polishes at a rate slower than that of the second layer and such that the remaining thickness of insulation at termination of polishing is known and is substantially planar, less then 500 Angstroms roughness; and removing any diamond or carbon-containing debris.

In an embodiment of the present invention, a semiconductor substrate having disposed thereon conductor traces and pads comprised of aluminum-based alloy, such as Al-Cu, is sputter coated with about 1 micron of a doped or non-doped glass such as SiO2 such that the entire substrate surface including traces, pads and any other surface features are coated with a layer of the glass. A layer comprising CVD diamond or DLC is deposited overall at a nondestructive temperature and the device is chem-mech polished for a time sufficient to achieve planarity. According to methods known in the art, but at low temperatures, the diamond or CVD film is deposited by the thermal, electrical or catalytic fragmentation of a carbon-containing material such as a hydrocarbon precursor, for example methane, ethane, ethylene, acetylene, alcohol and mixtures thereof. Residual carbon is removed, such as by reactive ion etching (RIE). The planarized device is ready to enter further processing whereby additional such devices are constructed to form a multilevel metal-semiconductor structure.

BRIEF DESCRIPTION OF THE PREFERRED EMBODIMENTS

In order to facilitate understanding of the present invention, reference is made to the following detailed description taken in conjunction with the above described drawing.

EXPERIMENTAL

Figure 1:
FIG. 1 is a flow chart of the process of the invention.
Figure 1:
Figure 1:
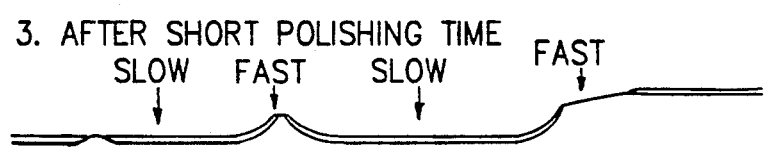
Figure 1:
Figure 1:

Wafers with a 3.0 micron film of bias sputtered quartz (BSQ), over the metal lines as shown in FIG. 1-1 were coated with a conformal diamond-like carbon (DLC) deposited from a hydrocarbon precursor by CVD at about 75 to about 350 degrees C. as shown in FIG. 1-2. The depositions were split between 750 Angstroms and 1000 Angstroms thick films to determine the optimum DLC thickness required for planar polishing. The topography on the metal pads where the film thickness was measured before polishing was 1.2 microns.

The wafers were polished using a standard oxide planarization process: 8:1 water/colloidal silica slurry, 15 psi pressure, 40 RPM for both quill and table speed. Two different polishing pads were evaluated, the IC-60, a hard pad, and the IC-40, a softer pad, Shore C hardness 70 and 55, respectively, from Rodel Inc. Newark, Del. The endpoint was determined by measuring the SiO2 thickness after polishing. Polishing pressure ranged from about 2 to about 10 lbs/in2, with the preferred conditions being in the lower range.

The advantage to using the DLC occurs when using the softer pad. Polishing with the softer pad results in less degradation of the SiO2 thickness uniformity across the wafer. It is surmised that this is true because the soft pad is more conformal, so that there is uniform removal of BSQ from both the high and low topography areas on the wafers. The DLC in these areas protects the BSQ from polishing until the surface is planar. No difference in the thickness uniformity or planarity was observed between polished wafers with and without the DLC film when processed using the harder pad. Actual BSQ removal over the raised (topographical) features was inhibited until the DLC film was removed.

The effect of the DLC is very evident with the use of the softer IC-40 pad. The wafers without the protection of the DLC film show removal of material from the pad and the field regions almost immediately after polishing starts. The result of this effect is that topography remains around large features. The softness of the pad prevents planarization over these areas. The wafers protected with the DLC film demonstrate the removal of the BSQ over the pads while protecting the field regions. The 1000 Angstrom DLC film inhibits the removal of material from the raised features much longer than the 750 Angstrom film. The thinner film is adequate to allow the pads to polish down to the field, and yields a more planar surface than the wafers without the DLC. The gradual planarization is shown in FIGS. 1-3, 1-4, and 1-5.

Oxygen ashing was used to remove the DLC layer using a power density of about 200 to about 500mW/cm2 at a pressure of about 30 to about 100MTorr. A removal rate of 100nm/min has been achieved at 100mTorr pressure. In that oxygen ashing of DLC carbon results in the formation of CO2 as a sole product, it is cleanly removed from the wafer, enabling further sequential use of the method without adding unknown materials to the final product. In the end, the resultant structure remains unaltered apart from improved planarity.

It is understood that the invention may be embodied in modifications of the present invention forms, for example, to planarize other materials, without departing from the spirit or central characteristics thereof. The aforementioned examples and embodiments are therefore to be considered in all respects as illustrative rather than restrictive, and the invention is not to be limited to the details given herein.

What is claimed is:

1. A method of planarizing a semiconductor device, comprising:
   providing a planar substrate on which is disposed topographical featuring;
   coating the substrate and topographical featuring overall with a first layer of insulating material;
   coating the first layer with a second layer comprising conformal diamond or diamond-like carbon material, wherein the diamond or diamond-like carbon is deposited within a temperature range of about 75 to about 350 degrees C. by CVD or sputtering;
   chemical-mechanical polishing with a polishing pad in a slurry such that the layers of material over the topographical featuring is removed at a faster rate than the material over the planar substrate; and
   stopping the process when substantial overall planarity is achieved.

2. The method recited in claim 1, further including the step of removing any residual carbon.

3. The method recited in claim 2, further including the step of building a VLSI device using a plurality of aligned layers of planarized semiconductor devices.

4. The method recited in claim 1, wherein the topographical featuring includes circuit traces and pads.

5. The method recited in claim 4, wherein the traces and pads are comprised of aluminum-copper alloy.

6. The method recited in claim 1, wherein the first layer comprises amorphous or crystalline $SiO_2$.

7. The method recited in claim 6, wherein the $SiO_2$ is deposited by sputtering.

8. The method recited in claim 1, wherein the diamond or DLC is deposited to a thickness of about 750 Angstroms to about 1000 Angstroms.

9. The method recited in claim 1, wherein the polishing pad comprises a pad having a Shore hardness of less than 70.

10. The method recited in claim 1 wherein the slurry comprises an aqueous colloidal silica slurry.

11. The method recited in claim 2, wherein the residual carbon is removed by RIE or oxygen ashing.

12. The method recited in claim 1, wherein the diamond or DLC is deposited within a temperature range of about 75 to about 300 degrees C.

13. The method recited in claim 12, wherein the diamond or DLC is deposited between about 200 degrees C. and about 250 degrees C.

14. The method recited in claim 1, wherein the hardness of the diamond or DLC ranges from about 3,000 to about 5,000 on the Vickers hardness scale.

15. The method recited in claim 1, wherein the layer of diamond or DLC is deposited by CVD by thermal chemical vapor deposition, plasma chemical vapor deposition, electron-assisted chemical vapor deposition, radio frequency plasma enhanced chemical vapor deposition, or direct current enhanced chemical vapor deposition.

16. The method recited in claim 1, wherein the second layer is energetically deposited from a hydrocarbon precursor.

17. The method recited in claim 1, wherein the etch rate ratio of the first layer of insulating material to diamond or diamond-like carbon is between about 19:1 and 311:1.

18. The method recited in claim 10, wherein the polishing pad has a Shore hardness of less than 70 to about 55.

19. The method recited in claim 10, wherein the polishing pressure is about 2 to about 10 lbs/in2.

20. The method recited in claim 19, wherein the polishing pressure is about 2 lbs/in2.

21. The method recited in claim 11, wherein the power density of the RIE plasma is maintained at about 100 to about 200mW/cm2 at a pressure of about 30 to about 100mTorr.

22. The method recited in claim 9, wherein the temperature at which the diamond or DLC is deposited is about 150 to about 250 degrees C.

23. The method recited in claim 7, wherein the $SiO_2$ is sputtered to a thickness of about 1 micron.

24. The method recited in claim 1, wherein the layer comprising diamond or DLC film is deposited by CVD by the thermal, electrical or catalytic fragmentation of a carbon-containing material.

25. The method recited in claim 16, wherein the hydrocarbon precursor comprises a hydrocarbon selected from the group consisting of methane, ethane, ethylene, acetylene and alcohol and mixtures thereof.

* * * * *